US010795452B2

(12) United States Patent
Sullivan et al.

(10) Patent No.: US 10,795,452 B2
(45) Date of Patent: Oct. 6, 2020

(54) MULTI-STAGE CURE BARE DIE LIGHT EMITTING DIODE

(71) Applicant: Microsoft Technology Licensing, LLC, Redmond, WA (US)

(72) Inventors: Benjamin Patrick Sullivan, Redmond, WA (US); James David Holbery, Bellevue, WA (US); Siyuan Ma, Bothell, WA (US); David Michael Lane, Sammamish, WA (US); Thomas Joseph Longo, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 79 days.

(21) Appl. No.: 15/890,937

(22) Filed: Feb. 7, 2018

(65) Prior Publication Data
US 2019/0243465 A1    Aug. 8, 2019

(51) Int. Cl.
*G06F 3/02* (2006.01)
*H01H 13/83* (2006.01)
(Continued)

(52) U.S. Cl.
CPC ........ *G06F 3/0202* (2013.01); *F21V 33/0052* (2013.01); *H01H 13/7065* (2013.01); *H01H 13/83* (2013.01); *H01L 25/0753* (2013.01); *H05K 1/181* (2013.01); *H05K 3/1216* (2013.01); *H01H 2219/039* (2013.01); *H01H 2219/062* (2013.01); *H01L 24/16* (2013.01); *H01L 24/32* (2013.01); *H01L 24/73* (2013.01); *H01L 24/81* (2013.01); *H01L 24/83* (2013.01); *H01L 24/91* (2013.01); *H01L 33/486* (2013.01); *H01L 2224/16238* (2013.01); *H01L 2224/293* (2013.01); *H01L 2224/2929* (2013.01); *H01L 2224/3015* (2013.01); *H01L 2224/32238* (2013.01); *H01L 2224/73204* (2013.01); *H01L 2224/81191* (2013.01); *H01L 2224/81903* (2013.01); *H01L 2224/83192* (2013.01); *H01L 2224/83851* (2013.01); *H01L 2224/83856* (2013.01); *H01L 2224/83862* (2013.01);
(Continued)

(58) Field of Classification Search
CPC .......................... G06F 3/0202; F21V 33/0052
USPC ....................................................... 362/23.03
See application file for complete search history.

(56) References Cited

U.S. PATENT DOCUMENTS 5,138,119 A    8/1992  Demeo
5,471,023 A   11/1995  Kaizu et al.
(Continued)

FOREIGN PATENT DOCUMENTS

EP       0714553 A1    6/1996
WO    2016156853 A1   10/2016

OTHER PUBLICATIONS

"International Search Report & Written Opinion Issued in PCT Application No. PCT/US19/014854", dated Apr. 15, 2019, 14 Pages.

Primary Examiner — William N Harris
(74) Attorney, Agent, or Firm — Holzer Patel Drennan

(57) ABSTRACT

User expectations demand that keypad layout and size, as well as keypad performance and illumination remain the same or improve over time. In various implementations, the keyboards disclosed and detailed herein incorporate an array of thermoset bare die light emitting diodes in an effort to more evenly distribute light through a keyboard structure without increasing keyboard thickness, as compared to prior art designs.

17 Claims, 5 Drawing Sheets

(51) Int. Cl.
*H01H 13/7065* (2006.01)
*H05K 1/18* (2006.01)
*H01L 25/075* (2006.01)
*H05K 1/09* (2006.01)
*H05K 1/11* (2006.01)
*H05K 1/02* (2006.01)
*H01L 23/00* (2006.01)
*H05K 3/32* (2006.01)
*H01L 33/48* (2010.01)
*F21V 33/00* (2006.01)
*H05K 3/12* (2006.01)

(52) U.S. Cl.
CPC ........... *H05K 1/0274* (2013.01); *H05K 1/095* (2013.01); *H05K 1/111* (2013.01); *H05K 3/321* (2013.01); *H05K 2201/10106* (2013.01); *H05K 2201/2054* (2013.01); *H05K 2203/0278* (2013.01)

(56) References Cited

U.S. PATENT DOCUMENTS

| | | | |
|---|---|---|---|
| 5,857,767 A | 1/1999 | Hochstein | |
| 6,498,051 B1 * | 12/2002 | Watanabe | H01L 24/29 257/704 |
| 7,070,349 B2 | 7/2006 | Dombrowski et al. | |
| 7,525,534 B2 | 4/2009 | Skillman et al. | |
| 7,952,107 B2 | 5/2011 | Daniels et al. | |
| 10,347,443 B1 * | 7/2019 | Wu | G02B 6/005 |
| 10,381,176 B2 * | 8/2019 | Peterson | G02B 6/0073 |
| 10,468,211 B2 * | 11/2019 | Leong | H01H 13/86 |
| 2003/0102466 A1 * | 6/2003 | Kumakura | C09J 9/02 252/511 |
| 2003/0103359 A1 | 6/2003 | Chiang et al. | |
| 2008/0130263 A1 | 6/2008 | Liu et al. | |
| 2013/0056749 A1 | 3/2013 | Tischler et al. | |
| 2013/0229356 A1 * | 9/2013 | Marwah | H01H 13/704 345/170 |
| 2013/0270090 A1 * | 10/2013 | Lee | H01H 13/84 200/5 |
| 2014/0071654 A1 * | 3/2014 | Chien | H01H 13/704 362/23.03 |
| 2014/0166456 A1 * | 6/2014 | Chen | H01H 13/83 200/5 A |
| 2015/0136573 A1 | 5/2015 | Peterson et al. | |
| 2015/0325755 A1 | 11/2015 | Speer et al. | |
| 2016/0049266 A1 * | 2/2016 | Stringer | H01H 13/704 200/5 A |
| 2016/0336128 A1 * | 11/2016 | Leong | H01H 13/10 |
| 2016/0365204 A1 | 12/2016 | Cao et al. | |
| 2017/0048986 A1 | 2/2017 | Mei et al. | |
| 2019/0051473 A1 * | 2/2019 | Peterson | G06F 3/0202 |
| 2019/0212831 A1 * | 7/2019 | Goldberg | G06F 3/0202 |
| 2019/0214201 A1 * | 7/2019 | Leong | G06F 3/0202 |
| 2019/0237278 A1 * | 8/2019 | Yen | G06F 3/0202 |
| 2020/0013566 A1 * | 1/2020 | Chen | G06F 3/0202 |

* cited by examiner

MULTI-STAGE CURE BARE DIE LIGHT EMITTING DIODE

BACKGROUND

A computer keyboard or blade is a typewriter-style device having an arrangement of keys representing symbols or functions. The individual keys act as mechanical levers and electronic switches that convert physical operation of the keys into electronic signals that may be interpreted by a computing device to signify a user's selection of a corresponding symbol or function. As computing devices shrink in physical size and weight and become more portable, keyboards associated with the computing devices are also expected to shrink in physical size and weight. However, user expectations demand that keypad layout and size, as well as keypad performance and illumination, remain substantially the same or be improved.

Some prior art keyboard illumination solutions place a conventional top-firing light-emitting diode (LED) under each individual key of the keyboard. However, the relatively large footprint of conventional LEDs prevents even and consistent light propagation through apertures in an associated keypad supporting bracket, through the remainder of the keyboard assembly, and to a user. Further, the relatively large thickness of conventional LEDs may negatively affect overall keyboard thickness.

Other prior art keyboard illumination techniques utilize a limited number of centrally located side-firing LEDs combined with a waveguide plate. The waveguide plate distributes the light from the LEDs to individual keys and projects the light upward through apertures in the supporting bracket to illuminate the individual keys. While this arrangement requires fewer individual LEDs, the light distribution may be uneven, giving the user a low-quality impression of the associated keyboard. Further, the relatively large power requirement of the fewer individual LEDs to sufficiently illuminate the keyboard may result in a higher than desired power consumption of the keyboard, as well as user-perceptible heat generated by the LEDs and shortened lifespan of the LEDs. Still further, the waveguide plate may also negatively affect overall keyboard thickness.

SUMMARY

Implementations described and claimed herein provide a light emitting structure comprising a pair of conductive traces, a pair of multi-stage cure polymeric conductive pads, and a bare die light-emitting diode (LED). Each of the conductive pads are attached and electrically connected to the one of the conductive traces. The bare die LED includes a pair of leads, each of the leads are attached to and electrically connect the bare die LED to one of the conductive pads.

Implementations described and claimed herein further provide a method of manufacturing a light emitting structure. The method comprises applying a pair of conductive traces to a substrate, applying a pair of multi-stage cure polymeric conductive pads to the substrate, each of the conductive pads attached and electrically connected to the one of the conductive traces. The method comprises attaching each of a pair of leads on a bare die LED to and in electrical contact with one of the conductive pads.

Implementations described and claimed herein further still provide an illuminated structure comprising an illumination layer. The illumination layer includes a network of conductive traces, an array of multi-stage cure polymeric conductive pads, and an array of bare die LEDs. Each of the conductive pads are attached and electrically connected to an end of the conductive traces. Each of the bare die LEDs has a pair of leads, and each of the leads are attached to and electrically connect one of the LEDs to one of the conductive pads.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

In various implementations, the keyboards disclosed and detailed herein incorporate an array of thermoset (or multi-stage cure) bare die light emitting diodes arranged and bonded in a particular pattern to more evenly distribute light through a keyboard structure without increasing keyboard thickness, as compared to prior art designs. The disclosed thermoset (or multi-stage cure) bare die light emitting diodes are intended to address some or all of the foregoing problems, as well as additional problems not specifically identified herein.

Figure 1:
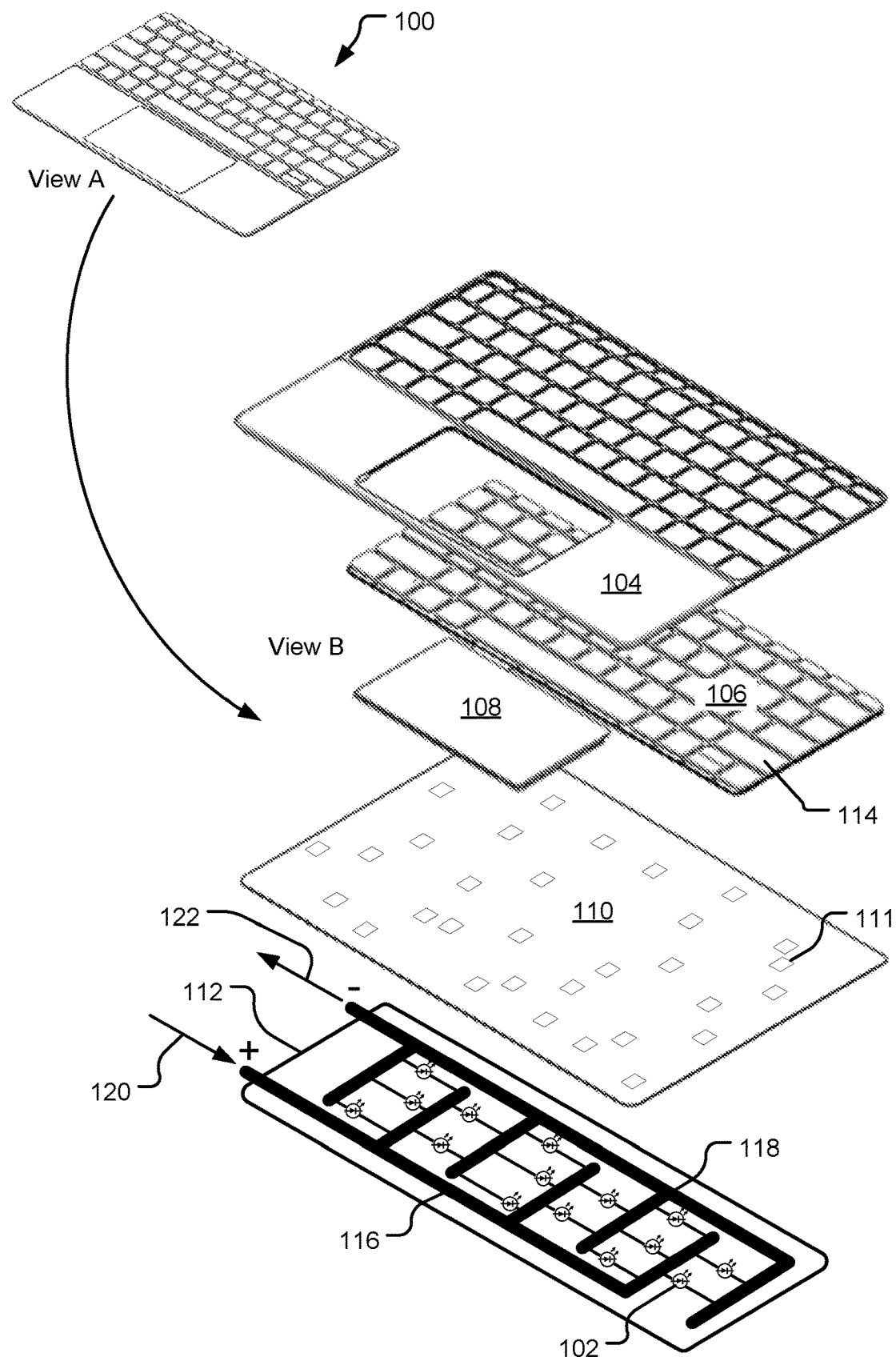
FIG. 1 illustrates a perspective view (assembled and exploded) of an example keyboard incorporating an array of thermoset bare die light emitting diodes (LEDs) for under-key illumination.

FIG. 1 illustrates a perspective view (assembled and exploded) of an example keyboard 100 incorporating an array of thermoset (or multi-stage cure) bare die light emitting diodes (e.g., LED 102) for under-key illumination. View A illustrates the keyboard 100 in an assembled configuration, while View B illustrates the keyboard 100 in an exploded view to better illustrate various constituent components of the keyboard 100. While the keyboard 100 is depicted alone in FIG. 1, in practice, it may be combined with a display portion or other component of an overall computing device (e.g., a tablet computer, laptop computer, personal computer, gaming device, smart phone, or any other discrete device that carries out one or more specific sets of arithmetic and/or logical operations).

The keyboard 100 includes a top bezel 104, which is combined with a bottom bezel or backer (not shown) to form a structure for securing a keypad 106, a touchpad 108, a supporting bracket 110, and an illumination layer 112 within the keyboard 100. The keypad 106 contains an array of keys (e.g., key 114) arranged in a predetermined pattern (e.g., QWERTY). Each key within the keypad 106 may be communicatively connected to a flexible flat cable (not shown) that provides connectivity to an associated computing device. In various implementations, the keypad 106 further includes a flexible membrane printed with electrical surfaces or traces (not shown, see e.g., membrane switch 232 of FIG. 2), as well as scissor mechanisms associated with each of the keys (not shown, see e.g., scissor mechanism 228 of FIG. 2).

The touchpad 108 (alternatively a trackpad or mousepad) converts physical user inputs into corresponding electrical signals that may be interpreted by the associated computing device. The supporting bracket 110 is a relatively rigid metallic or plastic structure that serves to secure the individual scissor mechanisms (and associated keys), as well as the membrane switch array in a desired position with predetermined spacing between the individual keys. In further implementations, the top bezel 104 and the bottom bezel may secure additional electronic components or other user interface components (e.g., dials, knobs, lights, displays, and sensors) within the keyboard 100.

The illumination layer 112 includes an array of thermoset bare die light emitting diodes (e.g., LED 102) of a flip-chip design. The thermoset bare die light emitting diodes are much smaller than conventional top-fire packaged LEDs. For example, a conventional top-fire packaged LED may be 300-600 microns tall, while the thermoset bare die light emitting diodes may only be 50-90 microns tall, with a 250-350 micron by 100-200 micron plan.

Each lead (not shown, see e.g., leads 456, 458 of FIG. 4) of each bare die LED is attached to a thermoset conductive pad (not shown, see e.g., thermoset conductive pads 440, 442 of FIG. 4) on the illumination layer 112. The thermoset conductive pads are each electrically connected to a conductive trace network including a positive portion 116 and a negative portion 118. In operation, a voltage differential is applied to the conductive trace network, as shown. Current flows through the conductive trace network and the individual bare die LEDs, as shown by arrows 120, 122 to illuminate the bare die LEDs.

In various implementations, the illumination layer 112 is sized and oriented to underlie the keypad 106. The bare die LEDs are placed on the illumination layer 112 with a spaced arrangement so that they align with apertures (e.g., aperture 111) in the supporting bracket 110 to transmit a maximum quantity of light generated by the bare die LEDs through the supporting bracket 110 to illuminate the keypad 106. The arrangement and relative size of the conductive trace network, as well as the number and relative positioning of the bare die LEDs depicted in FIG. 1 is an example only. In various implementations, the number and placement of the bare die LEDs will be defined by the lighting requirements of the keyboard 100, or other structure to be illuminated. Further, the arrangement and relative size of the conductive trace network will be defined by the number and relative positioning of the bare die LEDs, including the overall power requirement to illuminate the bare die LEDs and a desired placement of the conductive trace network.

In various implementations, the illumination layer 112 is formed of a resilient plastic substrate (e.g., an acrylic or polycarbonate membrane). The conductive trace network is formed of a metal or metallic alloy (e.g., aluminum, copper, chromium, iron, magnesium, nickel, titanium, silver, gold, zinc, or an alloy thereof). The thermoset conductive pads are formed of a similar metal or metallic alloy (as a conductive filler) embedded in a cured polymer (e.g., an epoxy, thermoset resin, thermoplastic, or polyamide). The bare die LEDs are un-encapsulated light-emitting diodes, which may have a conventional or flip-chip arrangement so long as each of a pair of leads is configured to attach to a pair of thermoset conductive pads oriented in the same or a similar plane. In some implementations, the illumination layer 112 adds 30-50 microns (or less than 100 microns) to the overall keyboard 100 thickness.

Figure 2:
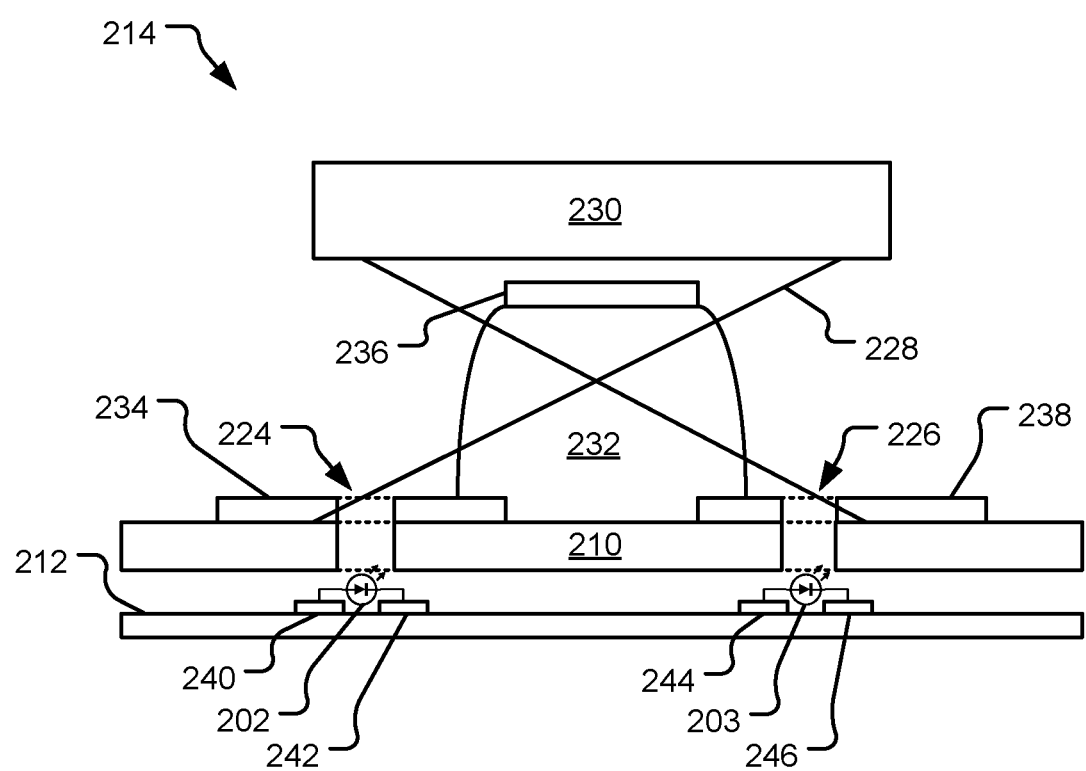
FIG. 2 illustrates a sectional elevation view of an example key incorporating thermoset bare die LEDs.

FIG. 2 illustrates a sectional elevation view of an example key 214 incorporating thermoset (or multi-stage cure) bare die LEDs 202, 203. In various implementations, the key 214 may be one of an array of keys in a keypad of a keyboard (not shown, see e.g., keypad 106 and keyboard 100 of FIG. 1). In other implementations, the key 214 may be a singular button actuator outside of a keyboard (e.g., a push-button on an electric or electronic appliance or machine).

The key 214 includes a supporting bracket 210, which serves as a mounting structure for key 214 components. While the supporting bracket 210 may be a singular continuous structure, it may include an array of apertures (e.g., apertures 224, 226 that permit light to pass through the supporting bracket 210. A scissor mechanism 228 is attached to a top side of the supporting bracket 210 and suspends a keycap 230 over the supporting bracket 210. The scissor mechanism 228 serves to attach the keycap 230 to the supporting bracket 210, while permitting the keycap 230 to be selectively depressed with reference to the supporting bracket 210. The scissor mechanism 228 also serves to maintain alignment of the keycap 230 to the supporting bracket 210.

The key 214 further includes a membrane switch 232, which includes electrically conductive structures 234, 236, 238 that selectively connect upon depression of the membrane switch 232 and are communicatively connected to a flexible flat cable (not shown) that provides connectivity to an associated computing device. Connection of the electrically conductive structures 234, 236, 238, signals to the computing device that the key 214 has been depressed by a user. Similarly, disconnection of the electrically conductive structures 234, 236, 238 signals to the computing device that the key 214 has been released by the user. In various implementations, the membrane switch 232 is a portion of a flexible membrane switch array that includes multiple similar membrane switches.

The key 214 further includes an illumination layer 212 oriented beneath the supporting bracket 210, and in some implementations, attached to a bottom surface of the supporting bracket 210. The illumination layer 212 includes an array of thermoset bare die LEDs (e.g., bare die LEDs 202, 203). A pair of leads from the bare die LED 202 are attached to thermoset conductive pads 240, 242 and another pair of leads of the bare die LED 203 are attached to thermoset conductive pads 244, 246. The thermoset conductive pads are each electrically connected to a conductive trace network (not shown, see e.g., conductive trace network 116, 118 of FIG. 1). In operation, a voltage differential is applied to the conductive trace network inducing a current to flow through the conductive trace network and through the bare die LEDs 202, 203, thus illuminating the bare die LEDs 202, 203.

The bare die LEDs 202, 203 are placed on the illumination layer 212 so that they align with the apertures 224, 226 in the supporting bracket 210 to transmit a maximum quantity of light generated by the bare die LEDs 202, 203 through the supporting bracket 210 and illuminate the key 214. The arrangement and relative size and positioning of the bare die LEDs 202, 203 is an example only. In various implementations, the number and placement of the bare die LEDs is defined by the lighting requirements of the key 214, and a related keypad and keyboard, or other structure to be illuminated.

In various implementations, the illumination layer 212 is formed of a resilient plastic substrate, with the conductive trace network formed of a metal or metallic alloy and the conductive pads 240, 242, 244, 246 formed of a similar metal or metallic alloy embedded in a cured epoxy. The bare die LEDs 202, 203 are un-encapsulated light-emitting diodes, which may have a conventional or flip-chip arrangement so long as each of a pair of leads is configured to attach to a pair of the conductive pads 240, 242, 244, 246 oriented in the same or a similar plane.

Figure 3:
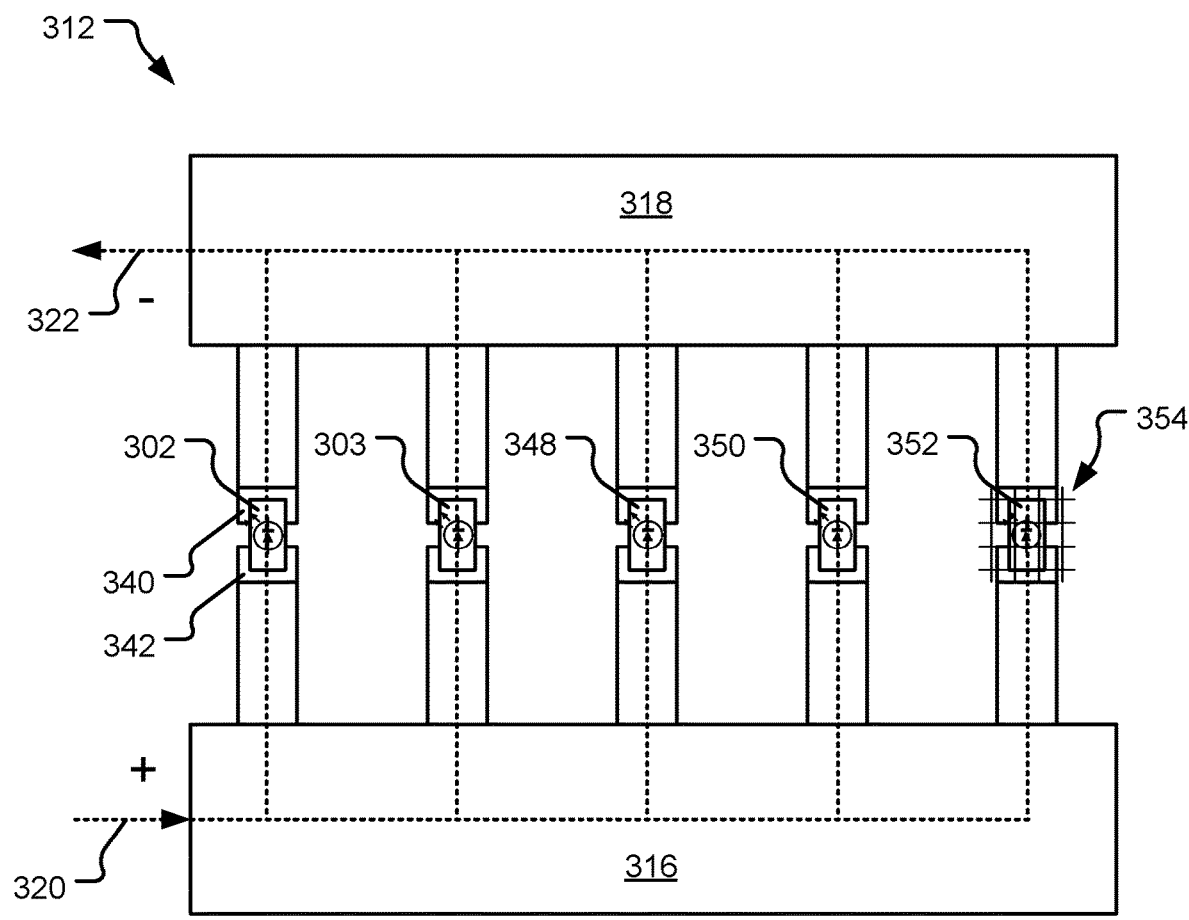
FIG. 3 illustrates a plan view of an example under-key illumination layer incorporating an array of thermoset bare die LEDs.

FIG. 3 illustrates a plan view of an example under-key illumination layer 312 incorporating an array of thermoset (or multi-stage cure) bare die LEDs 302, 303, 348, 350, 352. Each lead (not shown, see e.g., leads 456, 458 of FIG. 4) of each bare die LED is attached to a thermoset conductive pad on the illumination layer 312. For example, each of a pair of leads from the bare die LED 302 is attached to one of the thermoset conductive pads 340, 342. The thermoset conductive pads are each electrically connected to a conductive trace network including a positive portion 316 and a negative portion 318. In operation, a voltage differential is applied to the conductive trace network, as shown. Current flows through the conductive trace network and the individual bare die LEDs, as shown by dotted lines and arrows 320, 322 to illuminate the bare die LEDs 302, 303, 348, 350, 352.

In various implementations, the illumination layer 312 is sized and oriented to underlie a keypad of a keyboard to illuminate each of an array of keys within the keypad (not shown, see e.g., key 114, keypad 106, and keyboard 100 of FIG. 1). In other implementations, the illumination layer 312 is sized and oriented to underlie an array of push-buttons or other electric or electronic switches (e.g., a control panel for a machine or appliance).

A fabric 354 (illustrated by thin gridlines) covers the illumination layer 312 and the individual bare die LEDs 302, 303, 348, 350, 352 nest between adjacent threads of the fabric 354 and project light between and through the fabric 354. In the case of a woven fabric 354, the individual bare die LEDs 302, 303, 348, 350, 352 may nest between adjacent warp and weft threads of the woven fabric 354. In various implementations, other fabric morphologies may be used (e.g., knits) for the fabric 354. Due to the relatively small size of the bare die LEDs 302, 303, 348, 350, 352 and their placement within gaps between the threads of the fabric 354, a majority of the light generated by the bare die LEDs 302, 303, 348, 350, 352 is transmitted through the fabric 354, rather than being blocked by the fabric 354.

In various implementations, the fabric 354 serves to seal the illumination layer 312 from contaminates and hides the bare die LEDs 302, 303, 348, 350, 352 and seams between the various components of the illumination layer 312. In some implementations, two sheets of fabric are oriented on each side of the illumination layer 312 and are laminated together, sealing the illumination layer 312 therein. The fabric 354 may further offer a desirable tactile experience for the user. In an example implementation, the fabric 354 is approximately 0.5 mm thick.

The arrangement and relative size of the conductive trace network, as well as the number and relative positioning of the bare die LEDs 302, 303, 348, 350, 352 depicted in FIG. 3 is an example only. In various implementations, the number and placement of the bare die LEDs 302, 303, 348, 350, 352 is defined by the lighting requirements of a keyboard or other structure to be illuminated. Further, the arrangement and relative size of the conductive trace network is defined by the number and relative positioning of the bare die LEDs 302, 303, 348, 350, 352, including the overall power requirement to illuminate the bare die LEDs 302, 303, 348, 350, 352 and a desired placement of the conductive trace network.

In various implementations, the illumination layer 312 is formed of a resilient plastic substrate, with the conductive trace network formed of a metal or metallic alloy and the thermoset conductive pads formed of a similar metal or metallic alloy embedded in a cured epoxy. The bare die LEDs 302, 303, 348, 350, 352 are un-encapsulated light-emitting diodes, which may have a conventional or flip-chip arrangement so long as each of a pair of leads is configured to attach to a pair of thermoset conductive pads oriented in the same or a similar plane.

Figure 4:
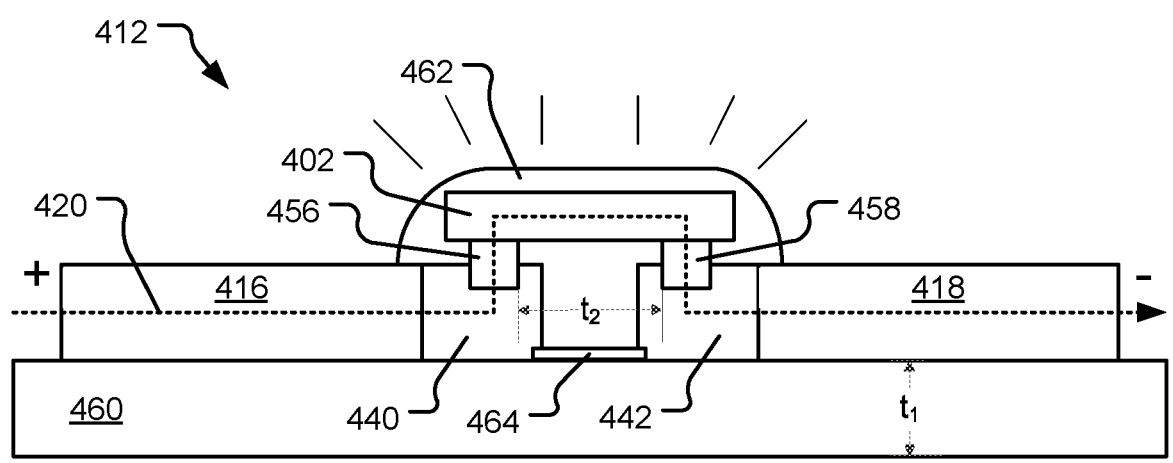
FIG. 4 illustrates a sectional elevation view of an example light emitting structure incorporating a thermoset bare die LED.

FIG. 4 illustrates a sectional elevation view of an example light emitting structure 412 incorporating a thermoset (or multi-stage cure) bare die LED 402. The light emitting structure 412 is created from a plastic or other non-conductive or dielectric substrate or film 460 onto which a pair of conductive traces 416, 418 are formed. The substrate 460 is a resilient plastic (e.g., an acrylic or polycarbonate membrane) and may be approximately 0.3 mm thick ($t_1$).

A pair of thermoset conductive pads 440, 442 are formed on and in electrically conductive contact with free ends of the conductive traces 416, 418, respectively. The bare die LED 402 includes a pair of leads 456, 458 projecting from a bottom side thereof, which serve as anode and cathode leads for the bare die LED 402. In various implementations the leads 456, 458 may have approximately a 90-micron gap therebetween ($t_2$), and thus a gap between the thermoset conductive pads 440, 442 may be even less than 90 microns (e.g., 40-60 micron). Such a small gap is not solder-able using conventional techniques, which leads to the solderless method of manufacturing discussed in detail below with reference to FIG. 5.

Lead 456 of the bare die LED 402 is embedded within thermoset conductive pad 440 and lead 458 of the bare die LED 402 is embedded within thermoset conductive pad 442. The result of which is an electrically conductive path through the conductive traces 416, 418, the thermoset conductive pads 440, 442, the leads 456, 458, and the bare die LED 402. In operation, a voltage differential is applied to the conductive trace network, as shown. Current flows through the light emitting structure 412, as illustrated by dotted arrow 420.

The light emitting structure 412 further includes a reflective structure 464 placed below the bare die LED 402. As many LEDs emit light from multiple surfaces, including bottom surfaces, the reflective structure 464 may reflect light emitted on the bottom surface of the bare die LED 402 upward to increase the effective light output from the bare die LED 402 projecting upward and away from the light emitting structure 412. In various implementations, the reflective structure 464 may be a reflective coating applied to the substrate 460 or a foil or other reflective structure attached to the substrate 460. In still further implementations, the reflective structure 464 is omitted.

The light emitting structure 412 still further includes an encapsulant 462 that seals top surfaces of the bare die LED 402 from the atmosphere. In various implementations, the encapsulant 462 reduces or prevents damage to the bare die LED 402 from oxidation, mechanical abrasion, and/or contamination. The encapsulant 462 may be a coating applied to the bare die LED 402 or a rigid dome or lens applied over the bare die LED 402. The rigid dome or lens may also be used to diffuse light emitted by the bare die LED 402. Still further, the encapsulant 462 may be a phosphorescent coating or cover (or a light conversion phosphor), which changes the visible color of light emitted from the bare die LED 402 (e.g., from green to white light). In still further implementations, the encapsulant 462 is omitted.

In various implementations, the light emitting structure 412 is sized and oriented to underlie a key within a keypad of a keyboard (not shown, see e.g., key 114, keypad 106, and keyboard 100 of FIG. 1). In other implementations, the light emitting structure 412 is sized and oriented to underlie a push-button or other electric or electronic switch. In still further implementations, a fabric (not shown, see e.g., fabric 354 of FIG. 3) covers the light emitting structure 412 and the bare die LED 402 nests between adjacent threads of the fabric. Due to the relatively small size of the bare die LED 402 and its placement within gaps between the threads of the fabric, a majority of the light generated by the bare die LED 402 is transmitted through the fabric, rather than being blocked by the fabric.

The arrangement and relative size of the various components of the light emitting structure 412 depicted in FIG. 4 is an example only. In some implementations, the thermoset conductive pads 440, 442 may overlap the conductive traces 416, 418, respectively, in order to increase electrical conductivity between the thermoset conductive pads 440, 442 and the conductive traces 416, 418. In various implementations, the conductive traces 416, 418 are formed of a metal or metallic alloy and the thermoset conductive pads 440, 442 are formed of a similar metal or metallic alloy embedded in a cured epoxy.

In some implementations, the thermoset conductive pads 440, 442 have a substantially higher electrical resistivity as compared to the conductive traces 416, 418 (e.g., approximately 10× higher resistivity). As a result, the relative size of the thermoset conductive pads 440, 442 may be minimized in favor of the conductive traces 416, 418. The bare die LED 402 may have a conventional or flip-chip arrangement so long as each the leads 456, 458 are configured to attach to the thermoset conductive pads 440, 442, which are oriented in the same or a similar plane on the substrate 460.

Figure 5:
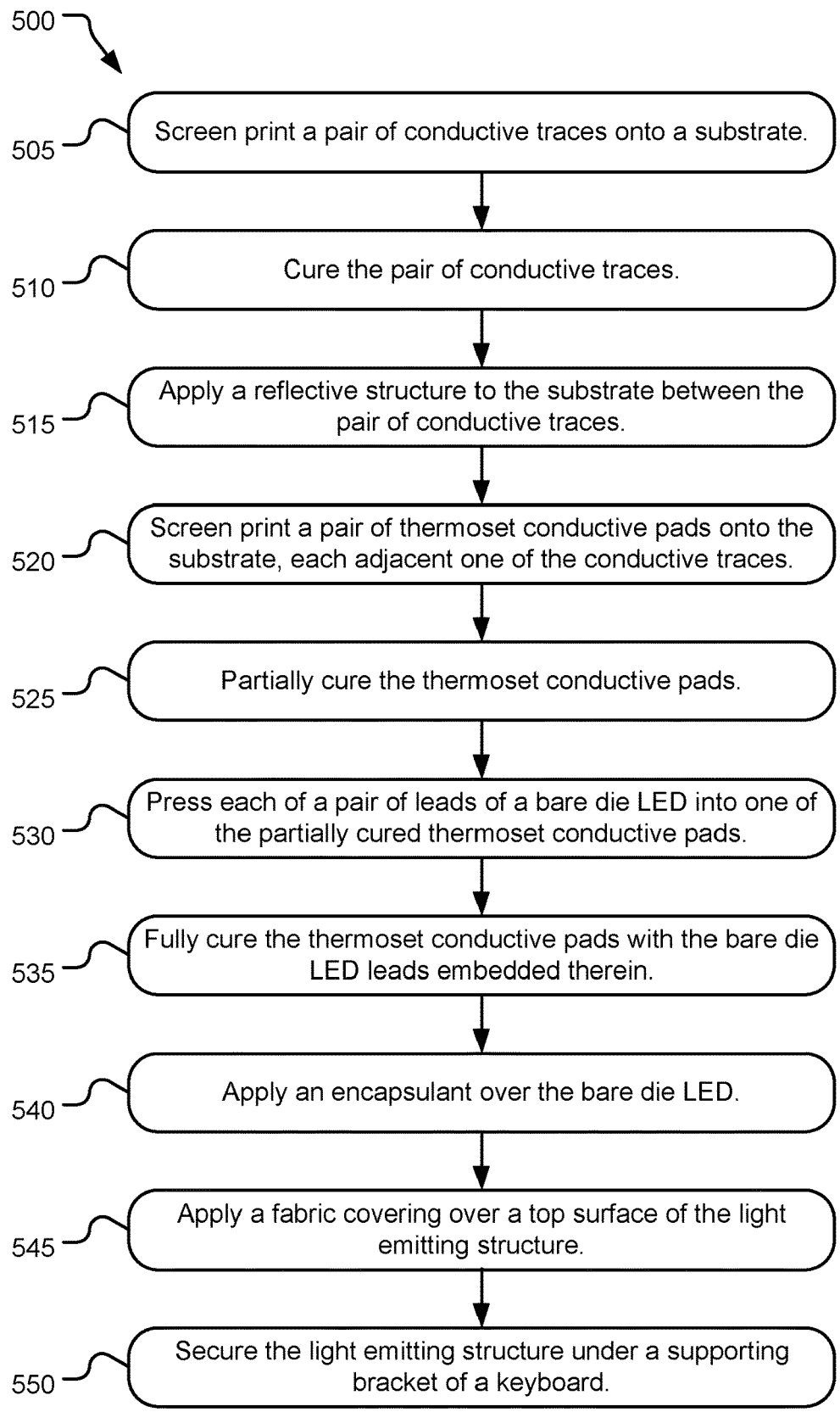
FIG. 5 illustrates example operations for manufacturing a light emitting structure incorporating a thermoset bare die LED.

FIG. 5 illustrates example operations 500 for manufacturing a light emitting structure incorporating a thermoset (or multi-stage cure) bare die LED. A first screen printing operation 505 screen prints a pair of conductive traces onto a dielectric or non-conductive substrate. In implementations where multiple bare die LEDs are to be applied to the substrate, a conductive trace network is printed onto the substrate. A first curing operation 510 applies heat to the printed conductive traces (or conductive trace network) to adhere them to the substrate.

The first screen printing operation 505 and the first curing operation 510 in combination may be referred to herein as applying the pair of conductive traces onto the substrate. In other implementations, the first screen printing operation 505 and first curing operation 510 may be replaced by another process to apply the conductive traces to the substrate (e.g., patterning, dispersing, depositing, and printing).

An applying operation 515 applies a reflective structure to the substrate between the pair of conductive traces. In various implementations, the applying operation 515 applies a reflective coating to the substrate or adheres a foil or other reflective structure to the substrate. In implementations where multiple bare die LEDs are to be applied to the substrate, the applying operation 515 applies multiple reflective structures where each of the multiple bare die LEDs are to be placed onto the substrate.

A second screen printing operation 520 screen prints (alternatively dispenses or pin transfers) a pair of thermoset conductive pads onto the substrate, each of thermoset conductive pads adjacent to one of the conductive traces. The thermoset conductive pads are placed in a manner that each is in electrically conductive contact with one of the conductive traces (e.g., overlapping with the conductive trace). In implementations where multiple bare die LEDs are to be applied to the substrate, a pair of thermoset conductive pads are printed onto the substrate where each of the multiple bare die LEDs are to be placed onto the substrate. In various implementations, the thermoset conductive pads are made of a B-stageable or 2-stage epoxy impregnated with metallic alloy particles (for electrical conductivity).

A second curing operation 525 applies heat to the thermoset conductive pads to adhere them to the substrate and partially cure the thermoset conductive pads. The second curing operation 525 is halted prior to a full cure of the thermoset conductive pads. As a result, the thermoset conductive pads are a tacky semi-solid following the second curing operation 525. In an example implementation, the second curing operation 525 is also performed at 50-70 degrees Celsius for 5-10 minutes.

The second screen printing operation 520 and the second curing operation 525 in combination may be referred to herein as applying the thermoset conductive pads onto the substrate. In other implementations, the second screen printing operation 520 and the second curing operation 525 may be replaced by another process to apply the thermoset conductive pads to the substrate (e.g., patterning, dispersing, depositing, and printing).

A pressing operation 530 presses each of a pair of leads of a bare die LED into one of the partially cured thermoset conductive pads. As the thermoset conductive pads are a tacky semi-solid in their partially cured state, the leads press into the thermoset conductive pads and become embedded therein. In various implementations, the pressing operation 530 is performed by a die bonder. In implementations where multiple bare die LEDs are to be applied to the substrate, the pressing operation 530 is repeated simultaneously or sequentially to adhere each of the bare die LEDs to the substrate.

A third curing operation 535 applies heat to the thermoset conductive pads with adhered bare die LED (or LEDs) to complete the curing process. The completely cured thermoset conductive pads yield a solid fixed electrically conductive connection with their respective embedded bare die LED lead, while maintaining some flexibility. In an example implementation, the third curing operation 535 is performed at 110-140 degrees Celsius for 20-40 minutes. The pressing operation 530 and the third curing operation 535 in combination may be referred to herein as attaching each of the pair of leads of the bare die LED to and in electrical contact with one of the thermoset conductive pads.

A second applying operation 540 applies an encapsulant (e.g., a phosphor or optically clear silicone cover) over the bare die LED (or LEDs). In various implementations, the encapsulant may be a point applied coating dispensed (or screen printed) over the bare die LED or a rigid cover (e.g., a dome or lens) attached over the bare die LED to protect it. Still further, the encapsulant may be a phosphorescent coating or cover, which changes the visible color of light emitted from the bare die LED.

A third applying operation 545 applies a fabric covering over a top surface of the light emitting structure. The fabric covers the light emitting structure and the bare die LED (or LEDs) nests between adjacent threads of the fabric and projects light between and through the fabric due to the relatively small size of the bare die LED and its placement within gaps between the warp and weft threads of the fabric.

In some implementations, the fabric covering applied in operation 545 meets and attaches to another fabric covering applied to a bottom surface of the light emitting structure at a seam. The entire fabric covering may conceal seams between the various components of the light emitting structure, as well as offer a desirable tactile experience for a user.

A securing operation 550 secures the light emitting structure under a supporting bracket of a keyboard, aligning the bare die LED (or LEDs) with an aperture (or apertures) in the supporting bracket to transmit light from the bare die LED (or LEDs) to a keypad attached to a top surface of the supporting bracket.

The operations making up the embodiments of the invention described herein are referred to variously as operations, steps, objects, or modules. Furthermore, the operations may be performed in any order, adding or omitting operations as desired, unless explicitly claimed otherwise or a specific order is inherently necessitated by the claim language.

An example light emitting structure according to the presently disclosed technology comprises a pair of conductive traces, a pair of multi-stage cure polymeric conductive pads, and a bare die light-emitting diode (LED) having a pair of leads. Each of the conductive pads are attached and electrically connected to the one of the conductive traces. Each lead of the LED is attached to and electrically connects the bare die LED to one of the conductive pads.

In another example light emitting structure according to the presently disclosed technology, the bare die LED is of a flip chip design.

In another example light emitting structure according to the presently disclosed technology, the conductive pads are of a cured metal-embedded epoxy.

In another example light emitting structure according to the presently disclosed technology, the conductive pads include one or both of a copper alloy and a silver alloy suspended within a polyamide matrix.

In another example light emitting structure according to the presently disclosed technology, each of the pair of leads is embedded within one of the conductive pads.

Another example light emitting structure according to the presently disclosed technology further comprises an encapsulant applied over the bare die LED.

In another example light emitting structure according to the presently disclosed technology, the encapsulant is one of a phosphorescent coating and a rigid cover.

In another example light emitting structure according to the presently disclosed technology, the light emitting structure has a total thickness of less than 300 micron.

Another example light emitting structure according to the presently disclosed technology further comprises a fabric adhered to a top surface of the light emitting structure. The bare die LED nests between adjacent threads of the fabric to emit light through the fabric.

An example method of manufacturing a light emitting structure according to the presently disclosed technology comprises applying a pair of conductive traces to a substrate, applying a pair of multi-stage cure polymeric conductive pads to the substrate, and attaching each of a pair of leads on a bare die light-emitting diode (LED) to and in electrical contact with one of the conductive pads. Each of the conductive pads are attached and electrically connected to the one of the conductive traces.

In another example method of manufacturing a light emitting structure according to the presently disclosed technology, applying the pair of conductive traces to the substrate includes printing the conductive traces on the substrate and curing the printed conductive traces.

In another example method of manufacturing a light emitting structure according to the presently disclosed technology, applying the pair of conductive pads to the substrate includes printing the conductive pads on the substrate and partially curing the conductive pads.

In another example method of manufacturing a light emitting structure according to the presently disclosed technology, attaching the leads of the LED to and in electrical contact with the conductive pads includes pressing the leads of the LED into the partially cured conductive pads and fully curing the conductive pads with the leads of the LED embedded therein.

Another example method of manufacturing a light emitting structure according to the presently disclosed technology further comprises applying a phosphorescent coating over the bare die LED.

Another example method of manufacturing a light emitting structure according to the presently disclosed technology further comprises applying a reflective structure beneath the bare die LED prior to attaching the pair of leads on the bare die LED to the conductive pads.

Another example method of manufacturing a light emitting structure according to the presently disclosed technology further comprises applying a fabric to a top surface of the light emitting structure, wherein the bare die LED nests between adjacent threads of the fabric to emit light through the fabric.

Another example method of manufacturing a light emitting structure according to the presently disclosed technology further comprises securing the light emitting structure under a supporting bracket of a keyboard.

An example illuminated structure according to the presently disclosed technology comprises an illumination layer, the illumination layer including a network of conductive traces, an array of multi-stage cure polymeric conductive pads, and an array of bare die light-emitting diodes (LEDs) each having a pair of leads. Each of the conductive pads are attached and electrically connected to an end of the conductive traces. Each of lead of the LED is attached to and electrically connects one of the bare die LEDs to one of the conductive pads.

Another example illuminated structure according to the presently disclosed technology further comprises a supporting bracket having an array of apertures and a keypad attached to a top surface of the supporting bracket. The bare die LEDs have a spaced arrangement within the network of conductive traces that matches the array of apertures in the supporting bracket. Light from the bare die LEDs projects through the supporting bracket to illuminate an array of keys on the keypad.

Another example illuminated structure according to the presently disclosed technology further comprises a fabric applied over the array of bare die LEDs. The bare die LEDs nest between adjacent threads of the fabric to emit light through the fabric.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A light emitting structure comprising:
   a supporting bracket with electrically conductive structures of a membrane switch mounted on top of the supporting bracket, the supporting bracket including an aperture;
   a pair of conductive traces extending across an illumination layer oriented below the supporting bracket;
   a pair of multi-stage cure polymeric conductive pads, each of the conductive pads attached and electrically connected to the one of the conductive traces; and
   a bare die light-emitting diode (LED) underlying the supporting bracket and aligned with the aperture in the supporting bracket, the bare die LED having a pair of leads, each of the leads attached to and electrically connecting the bare die LED to one of the conductive pads; and
   a fabric adhered to a top surface of the illumination layer and applied over the bare die LED, wherein the bare die LED nests between adjacent threads of the fabric to emit light through the fabric.

2. The light emitting structure of claim 1, wherein the bare die LED is of a flip chip design.

3. The light emitting structure of claim 1, wherein the conductive pads are of a cured metal-embedded epoxy.

4. The light emitting structure of claim 1, wherein the conductive pads include one or both of a copper alloy and a silver alloy suspended within a polyamide matrix.

5. The light emitting structure of claim 1, wherein each of the pair of leads is embedded within one of the conductive pads.

6. The light emitting structure of claim 1, further comprising:
   an encapsulant applied over the bare die LED.

7. The light emitting structure of claim 6, wherein the encapsulant is one of a phosphorescent coating and a rigid cover.

8. The light emitting structure of claim 1, having a total thickness less than 300 micron.

9. A method of manufacturing a light emitting structure comprising:
   mounting electrically conductive structures of a membrane switch on top of a supporting bracket, the supporting bracket including an aperture;
   applying a pair of conductive traces to a substrate;
   applying a pair of multi-stage cure polymeric conductive pads to the substrate, each of the conductive pads attached and electrically connected to the one of the conductive traces; and
   attaching each of a pair of leads on a bare die light-emitting diode (LED) to and in electrical contact with one of the conductive pads;
   aligning the bare die LED with the aperture in the supporting bracket, wherein the bare die LED underlies the supporting bracket; and
   adhering a fabric to a top surface of the light emitting structure and over the bare die LED, wherein the bare die LED nests between adjacent threads of the fabric to emit light through the fabric.

10. The method of claim 9, wherein applying the pair of conductive traces to the substrate includes:
    printing the conductive traces on the substrate; and
    curing the printed conductive traces.

11. The method of claim 9, wherein applying the pair of conductive pads to the substrate includes:
    printing the conductive pads on the substrate; and
    partially curing the conductive pads.

12. The method of claim 11, wherein attaching the leads of the bare die LED to and in electrical contact with the conductive pads includes:
    pressing the leads of the bare die LED into the partially cured conductive pads; and
    fully curing the conductive pads with the leads of the bare die LED embedded therein.

13. The method of claim 9, further comprising:
    applying a phosphorescent coating over the bare die LED.

14. The method of claim 9, further comprising:
    applying a reflective structure beneath the bare die LED prior to attaching the pair of leads on the bare die LED to the conductive pads.

15. The method of claim 9, further comprising:
    securing the substrate under the supporting bracket.

16. An illuminated structure comprising:
    a supporting bracket with electrically conductive structures of an array of membrane switches mounted on top of the supporting bracket, the supporting bracket having an array of apertures;
    an illumination layer including:
       a network of conductive traces;
       an array of multi-stage cure polymeric conductive pads, each of the conductive pads attached and electrically connected to an end of the conductive traces; and
       an array of bare die light-emitting diodes (LEDs), each having a pair of leads, each of the leads attached to and electrically connecting one of the bare die LEDs to one of the conductive pads, wherein the bare die LEDs have a spaced arrangement within the network of conductive traces that matches the array of apertures in the supporting bracket, wherein the bare die LEDs underlie the supporting bracket; and
    a fabric adhered to a top surface of the illumination layer and applied over the array of bare die LEDs, wherein the bare die LEDs nest between adjacent threads of the fabric to emit light through the fabric.

17. The illuminated structure of claim 16, further comprising:
    a keypad attached to a top surface of the supporting bracket, wherein light from the bare die LEDs projects through the supporting bracket to illuminate an array of keys on the keypad.

* * * * *